(12) United States Patent
Shiffer

(10) Patent No.: US 7,061,076 B2
(45) Date of Patent: Jun. 13, 2006

(54) SOLDERLESS COMPONENT PACKAGING AND MOUNTING

(75) Inventor: Stephen R. Shiffer, Pearl City, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/918,679

(22) Filed: Aug. 12, 2004

(65) Prior Publication Data

US 2006/0035410 A1  Feb. 16, 2006

(51) Int. Cl.
H01L 23/58 (2006.01)
(52) U.S. Cl. ................... 257/649; 257/700; 257/710
(58) Field of Classification Search .............. 257/649, 257/664, 691, 692, 700, 710, 728
See application file for complete search history.

(56) References Cited

U.S. PATENT DOCUMENTS

| | | | |
|---|---|---|---|
| 5,563,442 A | 10/1996 | Mahulikar et al. | 257/666 |
| 5,744,383 A | 4/1998 | Fritz | 438/111 |
| 5,994,648 A | 11/1999 | Glovatsky et al. | |
| 6,022,583 A | 2/2000 | Falcone et al. | 427/96 |
| 6,271,579 B1 * | 8/2001 | Going et al. | 257/664 |
| 6,274,650 B1 | 8/2001 | Cui | 523/457 |
| 6,489,229 B1 | 12/2002 | Sheridan et al. | 438/614 |
| 6,492,197 B1 | 12/2002 | Rinne | 438/108 |
| 6,707,135 B1 | 3/2004 | Madrid | 257/666 |
| 2002/0182773 A1 | 12/2002 | Su et al. | 438/111 |

FOREIGN PATENT DOCUMENTS

| | | |
|---|---|---|
| JP | 09205264 | 8/1997 |
| JP | 10321987 | 12/1998 |
| JP | 11087876 | 3/1999 |

OTHER PUBLICATIONS

PCT-Notification of Transmittal of The International Search Report and The Written Opinion of the International Searching Authority, or the Declaration, Date of Mailing Dec. 12, 2005.

* cited by examiner

*Primary Examiner*—Phuc T. Dang
(74) *Attorney, Agent, or Firm*—Kermit D. Lopez; Luis M. Ortiz

(57) ABSTRACT

An apparatus and method for providing three-dimensional carrier mounting of one or more electronic components. In accordance with one embodiment, the device mounting apparatus of the present invention includes an elastically resilient plastic substrate having component mounting surfaces in at least two dimensions. At least one press-fit component insertion cavity is disposed within the component mounting surfaces to provide compressive retention of the electronic component when press-fit into the cavity. Preferably, the cavity has a depth such that when the component is press-fit, it does not extend above the surface plane of the cavity. The insertion cavity is further characterized as including at least one conductive trace disposed on an inner surface of said insertion cavity and positioned on the insertion cavity surface such that the conductive trace contacts at least one lead of the electronic device retained within the insertion cavity.

18 Claims, 2 Drawing Sheets

SOLDERLESS COMPONENT PACKAGING AND MOUNTING

TECHNICAL FIELD

Embodiments are generally related to electronics device packaging and mounting techniques, and more particularly to a component mounting apparatus suitable for hostile sensor mounting applications. More particularly, embodiments are related to a specialized electronics packaging and corresponding component mounting apparatus that are structurally and functionally superior to traditional surface-mounted and press-fit technologies.

BACKGROUND OF THE INVENTION

Electronics packaging and mounting reliability issues are almost always associated with thermal-mechanical stresses. These issues are compounded by the industry's ongoing revolution in which the market demands smaller packages and higher density devices delivering more power and greater functionality. One of the weakest links in the hostile environment of a sensor package, for example, is the soldered joint utilized to attach the sensor components to a printed circuit board (PCB).

Several types of solder-based techniques have been used for attaching integrated circuit modules and/or discrete components to a suitable interconnecting forum, typically a PCB. One such traditional mounting technique involves positioning a component encased in a plastic material and having metal leads extending therefrom onto a PCB such that the leads extend into holes in the PCB. A solder joint is utilized to rigidly couple the leads to the PCB holes. Another solder-based mounting method, commonly known as surface mount technology (SMT), involves mounting the electronic components such that the leads are soldered onto the surface of a PCB rather than inserted into holes in the board.

Solder molding compounds have several significant performance characteristics that must be considered by a manufacturer for a given application. These items include temperature of glass transition, coefficient of thermal expansion (CTE), moisture absorption characteristics, flexural modulus and strength, and thermal conductivity.

These and other characteristics may contribute to problems associated with soldered mounting of electronic components including moisture sensitivity, cracked packages, open bond wires, intermittent electrical continuity failures, etc. Particularly when deployed in high-temperature environments, such as many automotive sensor applications, CTE mismatch strains can significantly compromise the strength and reliability of the solder joints in an electronics package. Most of these problems are not present in the devices prior to assembly onto PCBs but are the result of thermally induced stressing during assembly soldering or rework de-soldering.

An alternative approach to soldering PCB components on a common circuit substrate to form a functional unit such as an electronic sensor package is generally known as press-fit technology. A press-fit connection is made, as the name implies, through the pressing in of a contact pin into a PCB through hole. The important consideration here is that the cross-section diameter of the pin is greater that the diameter of the PCB hole. This difference in pin cross section and hole diameter results in deformation of either the PCB hole or the cross section of the pin during the insertion process of pin into a PCB through hole.

The two major press-fit techniques include a solid pin that does not deform in the insertion process and a compliant pin that compresses as a result of insertion into the PCB through hole. The compliant pin approach has proven more popular for achieving a reliable press fit contact for several reasons. First, the reduction in the size of press-fit section exerts less potentially damaging forces on the PCB through hole and greater tolerances can be accepted for the plated through hole. Furthermore, compliant pins result in lower required insertion forces, resulting in fewer logistical complications. Finally, compliant pins enable multiple press cycles into the same through holes.

In addition to being used for connecting components to a PCB, press fit technology is also commonly utilized in multilayer PCB applications in which press fit connector adapters are installed as effective plug-in adapters onto a PCB.

In view of the aforementioned problems with soldered PCB connection techniques, such press-fit technologies are rapidly emerging as a more attractive alternative for connecting multiple components to a common platform. Press-fit compliant solutions offer several advantages over soldering including providing simple, clean, robust and highly reliable interconnections, even in high-vibration and thermal cycling environments. Press-fit connectivity further eliminates the need for special features for PCB ground plane layers to minimize their heat sink effects when soldering. Use of press fit PCB connectivity eliminates the need to solder and consequently eliminates package exposure to the high temperatures associated with conventional soldering and wave soldering applications. The elimination of solder joints enhances long-term reliability by providing a more shock resistant connection. Furthermore, the use of press fit connections eliminates the need to wash the PCB as is required for removing flux and other soldering board residue.

While alleviating problems associated with soldering connectivity, conventional press-fit technologies pose several significant problems. Many of the drawbacks to conventional press-fit relate to the fine tolerances involved in positioning and pressing multiple pins into the very small press-fit holes. For example, the connector pins often protrude through the PCB when pressed thereon, requiring clearance holes or slots to be provided at all connector sites. Furthermore, high precision press positioning equipment including tooling pins is required to pre-align the PCB holes with the fixture. Furthermore, the aforementioned compliant pin approach results reduced component re-usability due to the deformation of component leads.

It can therefore be appreciated that a need exists for an improved apparatus and method for packaging and mounting electronic components to a substrate forum that alleviates some or all of the foregoing problems with soldering and conventional press-fit technologies. The present invention addresses such a need.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

An apparatus and method for providing three-dimensional carrier mounting of one or more electronic components are disclosed herein. In accordance with one embodiment, the device mounting apparatus of the present invention includes an elastically resilient plastic substrate having component mounting surfaces in at least two dimensions. At least one press-fit component insertion cavity is disposed within the component mounting surfaces to provide compressive retention of the electronic component when press-fit into the cavity.

Preferably, the cavity has a depth such that when the component is press-fit, it does not extend above the surface plane of the cavity. The insertion cavity is further characterized as including at least one conductive trace disposed on an inner surface of said insertion cavity and positioned on the insertion cavity surface such that the conductive trace contacts at least one lead of the electronic device retained within the insertion cavity.

All objects, features, and advantages of the present invention will become apparent in the following detailed written description.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The present invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

The present invention is directed to an apparatus and method for collectively mounting electronic devices, such as for a sensor or other electronics packages that eliminates many of the disadvantages of conventional printed circuit board (PCB) and press-fit technologies. More specifically, as and explained in further detail below with reference to the figures, the device mounting apparatus of the present invention employs a compliant/flexible substrate material that simultaneously serves as the multi-component frame, analogous to a PCB, and has material properties enabling it to be used to mechanically retain the components without the need for soldering or other mechanical or adhesive component coupling.

As utilized herein, "elastic," "elastomeric," and similar terms used to described the retention properties of a substrate are intended to refer to the mechanical property of an object material characterized in that a material is "elastic" of it changes shape due to an applied load, but that when the load is removed, recovers its original shape.

Figure 1:
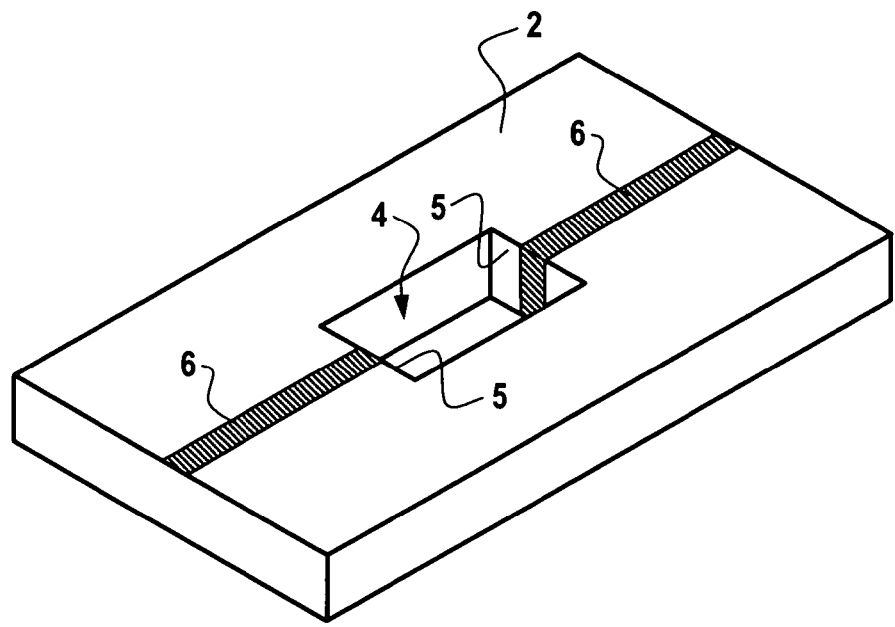
FIG. 1 depicts an apparatus for mounting an electronic component in accordance with one embodiment of the present invention.

With reference now to the figures, wherein like reference numerals refer to like and corresponding parts throughout, and in particular with reference to FIG. 1, there is depicted an apparatus for mounting an electronic device in accordance with one embodiment of the present invention. As shown in FIG. 1, the device mounting apparatus generally comprises a substrate member 2 having an open cavity insertion zone 4 in which an electronic device (not depicted) may be compressively retained. Although depicted as rectangular in the depicted embodiment, insertion zone 4 may be formed to have any of a variety of inner contours and dimensions to accommodate the shape and size of the particular electronic device or component for which insertion zone 4 is designed.

As further illustrated in FIG. 1, the device mounting apparatus further includes conductive traces 6 disposed in at least two planar dimensions on the surface of substrate member 2, from the upper surface plane and extending to the inside lateral surfaces 5 of the open cavity insertion zone 4. Assuming substrate member 2 comprises a plastic material, conductive traces 6 are preferably gold or a gold alloy. In alternative embodiments, conductive traces 6 may comprise other suitable metals or alloys including one or more of copper, nickel, gold, tin, aluminum and chrome.

Conductive traces 6 are positioned on the surfaces of the cavity insertion zone portion of substrate member 2 such that the traces contact the respective ends of an electronic device or component installed therein. Specifically, the depicted mounting apparatus is designed such that when an electronic component is press-fit into insertion zone 4, a pair of opposing inside lateral surfaces 5 of insertion zone 4 exerts an elastic compressive force to compressively retain the device within insertion zone 4 without the need for further coupling or fastening means such as soldering. To this end, and in an important feature of the depicted embodiment, substrate member 2 comprises an elastically resilient material, such as one of many well-known polymer composites. The portions of conductive traces 6 extending into insertion zone 4 on lateral surfaces 5 provide reliable electrical contact with corresponding device leads (depicted in FIG. 2) contacting the respective elastic surfaces.

Figure 2:
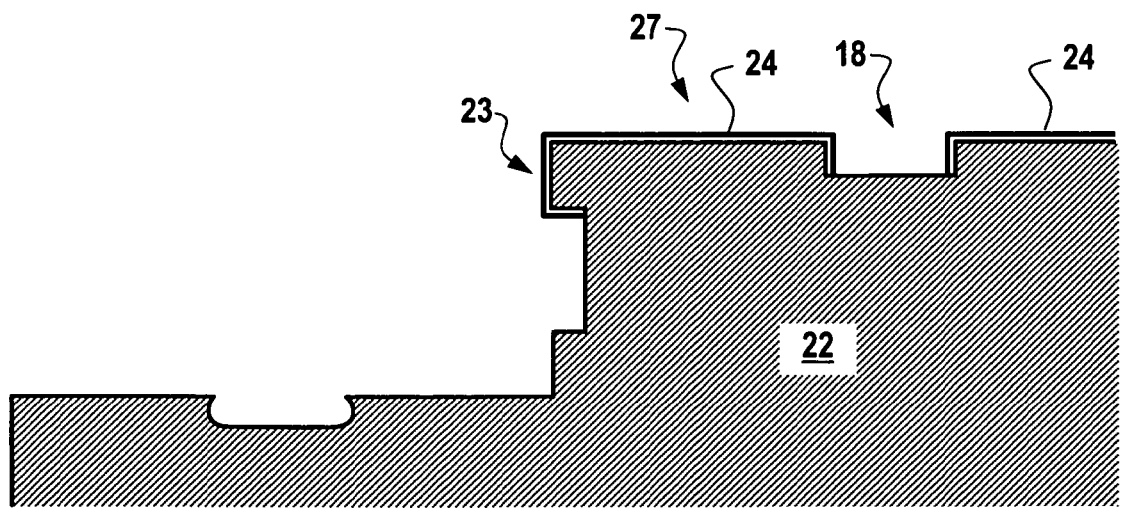
FIG. 2 illustrates an apparatus for providing multi-dimensional carrier device mounting in accordance with an alternate embodiment of the present invention.

Referring to FIG. 2, there is illustrated an apparatus for providing multi-dimensional device mounting in accordance with an alternate embodiment of the present invention. As shown in FIG. 2, the alternate embodiment apparatus, like that depicted in FIG. 1, generally includes a substrate material member 22 providing the device mounting framework and at least one press-fit component insertion cavity for press-fitting components onto the substrate. In particular, substrate member 22 can include multiple mounting surfaces 23, and 27 disposed in at least two different mounting planes. Furthermore, such mounting surfaces can include for example, a press-fit cavities, such as press fit cavity 18 that can be formed similarly in principle to the press-fit cavity 4 explained with reference to FIG. 1. Specifically, the cross-section depiction provided by FIG. 2 reveals a conductive trace 24 disposed on the surface of substrate 22 and extending onto the inner surfaces of opposing lateral sidewalls of the insertion cavities such that conductive trace 24 contacts at least one device lead of an electronic device retained therein. As with the previously depicted embodiment, the conductive traces illustrated in FIG. 2 are preferably gold or a gold alloy, but may also comprise other suitable metals or alloys.

FIG. 2 further illustrates the manner in which an electronic component (not shown) can be mounted within press-fit cavity 18. Specifically, an electronic component can be is mounted onto the apparatus by press-fitting the component into a press-fit cavity such as, for example, press-fit cavity 18 that can be sized to accommodate the electronic component while inside lateral walls can provide a sufficient compressive elastic force against a corresponding set of component leads (not depicted) disposed at the depicted lengthwise ends of the electronic component to mechanically and electrically couple and retain the component to substrate 22. In this manner, the electronic component may be hand- or machine-installed without the need for further bonding or adhesive coupling, thereby providing for convenient uninstallation and/or reinstallation of a previously installed component.

A significant advantage provided by the apparatus of the invention, and depicted in the side cross-section view of FIG. 2, is that it eliminates the need for soldering in a manner providing significant logistical advantages relating to the configuration and placement of the apparatus within another system. In particular, and with continued reference to FIG. 2, press-fit cavity 13 is preferably formed to have a depth at least sufficient such when an electronic component is press-fit therein, the component does not extend above the surface plane of mounting surface 21 from which the open cavity extends. By effectively embedding the components to maintain a flat or otherwise flush substrate surface contour, the mounting apparatus of the present invention provides a device framework that can be more flexibly and compactly deployed in a variety of systems having contouring and sizing limitations.

Figure 3:
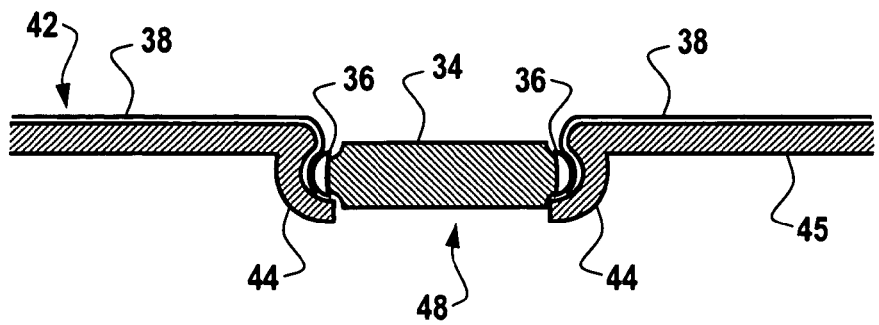
FIG. 3 depicts an alternate embodiment of the device mounting apparatus of the present invention utilizing a component snap-in feature.

With reference to FIG. 3, there is depicted an alternate embodiment of the device mounting apparatus of the present invention utilizing a component snap-in feature. Specifically, the embodiment shown in FIG. 3 is an apparatus for mounting one or more electronic devices or components generally comprising a substrate member 45 having an upper surface boundary 42 below which a snap-in insertion zone 48 is disposed. Snap-in zone preferably 48 is designed to accommodate an electronic component having specified dimensions and lead structures. As shown in the depicted embodiment, snap-in zone 48 is characterized as including a pair of opposing flexible component retention members 44 extending beneath the substrate boundary surface 42 and compressively retaining an electronic component 34 within a snap-in surface contouring of the retention members 44.

As with the embodiments depicted in FIGS. 1 and 2, substrate 45 preferably comprises an elastic/resilient plastic material. Furthermore, the snap-in device mounting apparatus shown in FIG. 3 includes conductive traces 38 disposed on the surface of substrate member 45 and extending to the inside surfaces of component retention members 44. In this manner, a corresponding set of one or more device leads 36 are maintained in compressive contact with the respective opposing portions of conductive traces 38 with electronic component 34 mounted on the apparatus.

Figure 4:
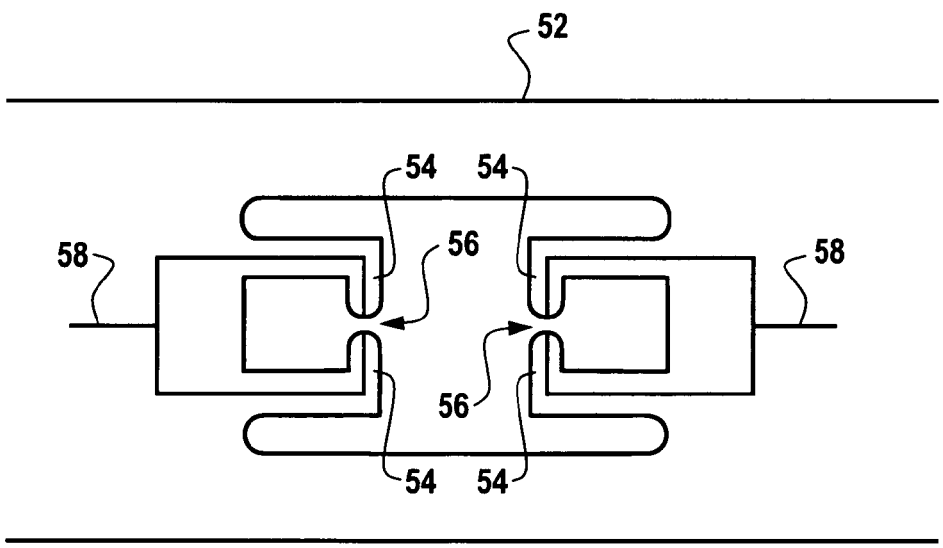
FIG. 4 illustrates an electronic device mounting apparatus utilizing an alternative snap-in mechanism in accordance with the present invention.

FIG. 4 illustrates a variation of the snap-in embodiment of FIG. 3 in accordance with an alternate embodiment. The mounting apparatus of FIG. 4 generally comprises a substrate 52 having conductive traces 58 extending into a snap-in insertion zone 56. In contrast to the embodiment shown in FIG. 3, the insertion zone 56 is characterized as comprising a pair of dual-set component retention arms 54 that provide additionally secure mechanical coupling to the apparatus.

Figure 5:
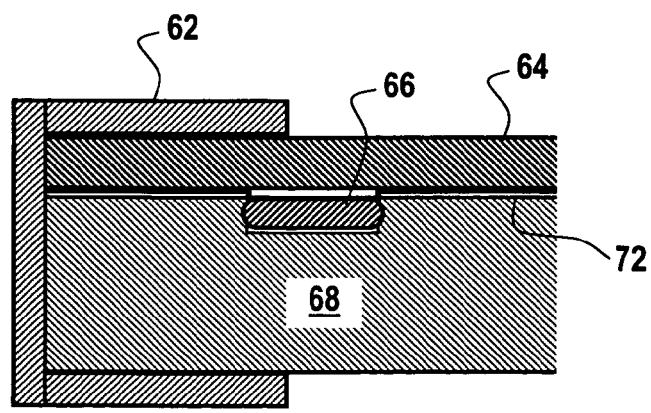
FIG. 5 depicts an electronic device mounting apparatus utilizing a covered and clip design in an alternate embodiment of the present invention.

With reference to FIG. 5, there is depicted an electronic device mounting apparatus employing a "sandwich" type snap-in design. Similar to the previously described embodiments, the mounting apparatus shown in FIG. 5 generally comprises a plastic substrate 68 having a conductive trace 72. As with the previous embodiments, conductive trace 72 is disposed on the surface of the elastic insertion zone formed by the depicted well in substrate 68 such that conductive trace 72 contacts the respective leads of as electronic device 66 retained therein.

In addition, the mounting apparatus depicted in FIG. 5 includes a lid member 64 that is disposed over the open cavity insertion zone formed in substrate 68 to compressively retain electronic device 66 securely within the insertion zone. Such compressive retention may be particularly useful for applications, such as electronic vehicle sensors wherein the device packaging is subjected to considerable dynamic forces, acceleration, and other dynamic stresses. As further depicted in FIG. 5, the mounting apparatus may include a clip 62 that applies a compressive force between substrate 68 and lid member 64 to securely retain the lid member in position. Under severe thermal conditions, clip 62 may be utilized to maintain a sufficient structural retention force thus ensuring component 66 remains securely seated within the insertion zone.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The invention claimed is:

1. An apparatus for mounting one or more electronic devices, said apparatus comprising:
    a substrate member having an elastic insertion zone in which an electronic device may be compressively retained;
    a lid member disposed over said elastic insertion zone, wherein said lid member provides a cover for retaining said electronic device;
    a clip that applies a compressive force between said substrate member and said lid member to securely retain said lid member in position; and
    at least one conductive trace disposed on the surface of said elastic insertion zone, wherein said conductive trace is positioned on the insertion zone surface such that the conductive trace contacts at least one lead of the electronic device retained within the insertion zone.

2. The apparatus of claim 1, wherein said substrate member comprises a plastic material.

3. The apparatus of claim 1, wherein said at least one conductive trace comprises a metal pattern applied in at least two dimensions on the surface of said substrate member.

4. The apparatus of claim 1, wherein said at least one conductive trace comprises a metal or metallic alloy comprising one or more of copper, nickel, gold, tin, aluminum and chrome.

5. The apparatus of claim 1, wherein said elastic insertion zone comprises at least two opposing lateral surfaces, at least one of said opposing lateral surfaces comprising a substantially elastic plastic.

6. The apparatus of claim 1, wherein said elastic insertion zone is formed as an open cavity within said substrate member.

7. The apparatus of claim 6, wherein said elastic insertion zone is designed to mechanically engage and retain the electronic component, said open cavity characterized as having a depth at least sufficient such that when the electronic component is press-fit therein, the electronic component does not extend above the surface plane of said open cavity.

8. An apparatus for providing three-dimensional carrier mounting of one or more electronic components, said apparatus comprising:
a plastic substrate having component mounting surfaces in at least two dimensions; and
at least one press-fit component insertion cavity disposed within the component mounting surfaces, said insertion cavity characterized as including at least one conductive trace disposed on an inner surface of said insertion cavity, wherein said conductive trace is positioned on the insertion cavity surface such that the conductive trace contacts at least one lead of the electronic device retained within the insertion cavity.

9. The apparatus of claim 8, wherein said plastic substrate comprises an elastic polymer material.

10. The apparatus of claim 8, wherein said at least one conductive trace comprises a metal pattern disposed on the mounting surfaces of said plastic substrate.

11. The apparatus of claim 8, wherein said at least one conductive trace comprises a metal or metallic alloy comprising one or more of copper, nickel, gold, tin, aluminum and chrome.

12. The apparatus of claim 8, wherein said insertion cavity comprises at least two opposing lateral surfaces, at least one of said opposing lateral surfaces comprising a substantially elastic plastic.

13. The apparatus of claim 12, wherein said insertion cavity is designed to mechanically engage and retain an electronic component, said insertion cavity characterized as having a depth at least sufficient such that when the electronic component is press-fit therein, the electronic component does not extend above the surface plane of said open cavity.

14. An apparatus for mounting one or more electronic devices, said apparatus comprising:
a substrate member having an upper surface boundary and including a snap-in insertion zone characterized as comprising at least one pair of opposing flexible component retention members extending beneath the surface of said substrate member and mutually disposed to compressively retain an electronic device installed therein; and
at least one conductive trace disposed on the respective inner surfaces of the component retention members such that the conductive trace contacts at least one lead of the electronic device retained within the snap-in insertion zone.

15. The apparatus of claim 14, wherein said substrate member comprises a plastic material.

16. The apparatus of claim 14, wherein said at least one conductive trace comprises a metal pattern applied in at least two dimensions on the surface of said substrate member.

17. The apparatus of claim 14, wherein said at least one conductive trace comprises a metal or metallic alloy comprising one or more of copper, nickel, gold, tin, aluminum and chrome.

18. The apparatus of claim 14, wherein said snap-in insertion zone is characterized as having a depth at least sufficient such that when the electronic component is snap-fit therein, the electronic component does not extend above the upper surface boundary of said substrate member.

* * * * *